Jan. 23, 1951 E. R. TOPORECK 2,539,042

AUTOMATIC GAIN CONTROL CIRCUIT

Filed Oct. 21, 1948

INVENTOR.
EDWARD R. TOPORECK
BY Wade Koontz
ATTORNEY
James S. Shannon
AGENT—

Patented Jan. 23, 1951 2,539,042

UNITED STATES PATENT OFFICE 2,539,042

AUTOMATIC GAIN CONTROL CIRCUIT

Edward R. Toporeck, Inyokern, Calif., assignor to the United States of America as represented by the Secretary of the United States Air Force Application October 21, 1948, Serial No. 55,756

4 Claims. (Cl. 178—44)

This invention described herein may be manufactured and used by or for the Government for governmental purposes without payment to me of any royalty thereon.

This invention relates to automatic gain control systems and particularly to an improved means for introducing an amplitude delay in such systems.

Radio receivers usually employ an automatic gain control circuit for maintaining the radio frequency signal applied to the final detector substantially constant over a wide range of variation in the amplitude of the received signal. This is usually accomplished by rectifying the radio frequency signal appearing just prior to the final detector to produce a negative voltage proportional to the average value thereof and by applying this voltage to the grids of the preceding radio frequency amplifier tubes to reduce their amplification factors. In order to prevent application of this negative voltage to the amplifying tubes and the consequent reduction in their gain during the reception of weak signals it is customary to employ a biased rectifying device which remains inoperative until the signal applied thereto exceeds a certain amplitude determined by the amount of the bias. This is usually referred to as an amplitude delay and in receivers so equipped the gain is maximum for received signals below the threshold value of the automatic gain control circuit as determined by the delay bias, while for signals above this point the automatic gain control circuit functions to hold the average value of the radio frequency signal applied to the final detector substantially constant at a value near or slightly above the threshold value of the automatic gain control circuit, depending upon its sensitivity.

It is the object of this invention to provide an improved means for effecting the above described amplitude delay. This is accomplished briefly by applying a positive bias, upon which the radio frequency signal is superimposed, to the grid of an amplifying tube preceding the rectifier in the automatic gain control circuit and utilizing the point of non-conductivity in the grid circuit to determine the threshold value of the control circuit.

Figure 3:
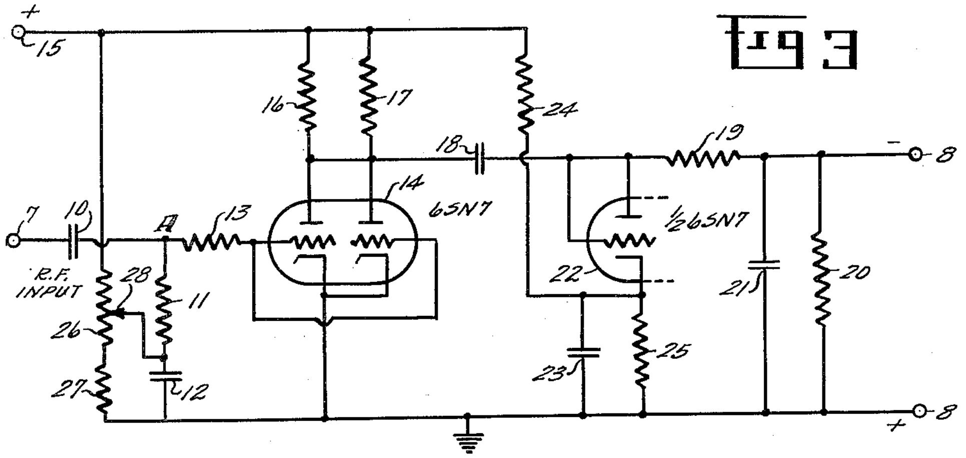
Figure 1:
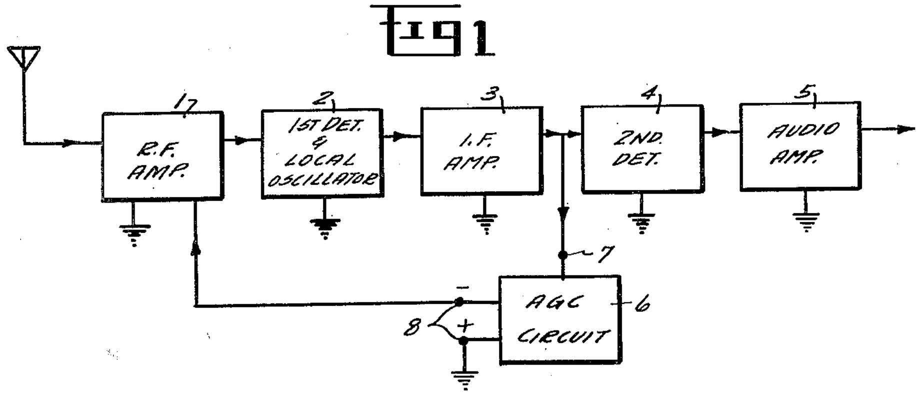
Figure 2:
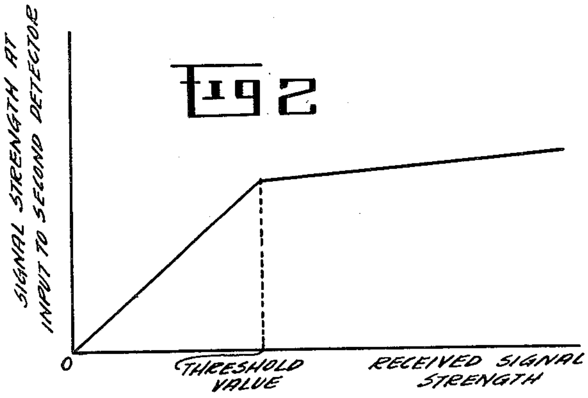

A specific embodiment of the invention is shown in the accompanying drawing in which Fig. 1 is a block diagram of a superheterodyne receiver in which the invention may be used, Fig. 2 is a curve showing the operating characteristic of a receiver employing the invention, and Fig. 3 is a schematic diagram of an automatic gain control circuit incorporating the invention.

Referring to Fig. 1 the superheterodyne receiver shown comprises radio frequency amplifier 1, first detector and local oscillator 2, intermediate frequency amplifier 3, second detector 4 and audio amplifier 5. An automatic gain control circuit 6, to which the invention relates, is coupled through terminal 7 to receive radio frequency energy from a point just preceding the second detector 4. This circuit produces a negative direct voltage across terminals 8 which is applied to radio frequency and intermediate frequency amplifiers 1 and 3 respectively to control their gain in accordance with signal strength so as to keep the average value of the radio frequency voltage at the input to the second detector substantially constant. As already pointed out the circuit 6 incorporates an amplitude delay which prevents voltage appearing at terminal 7 until the received signal exceeds a threshold value. The operation of the receiver in Fig. 1 is graphically illustrated in Fig. 2. Here it is seen that the signal strength at the input to the second detector is proportional to the received signal strength for received signals smaller than the threshold value and for received signal strengths above the threshold value the signal strength at the input to the second detector is maintained substantially constant.

Fig. 2 shows the schematic circuit diagram of block 6 in Fig. 1. The radio frequency voltage applied between terminal 7 and ground appears across resistor 11 the upper end of which is coupled to terminal 7 through blocking condenser 10 and the lower end of which is maintained at ground potential for radio frequencies by by-pass condenser 12. The upper end of resistor 11, which will be designated point A, is connected through resistor 13 to the grid of an amplifier tube 14 which, in the circuit illustrated, consists of the two sections of a dual triode tube type 6SN7 connected in parallel. The anodes of tube 1 are supplied with operating potential by being connected to a point of positive potential 15 through parallel load resistors 16 and 17. The anodes are also coupled through blocking condenser 18 and filter resistor 19 to the upper end of resistor 20 the lower end of which is grounded. Resistor 20 is also shunted by filter condenser 21 which cooperates with resistor 19 to produce a low-pass filter. The anode of rectifier 22 is connected to a point between condenser 18 and resistor 19 and the cathode thereof is maintained at ground potential for radio frequency by the by-passing action of condenser 23. The rectifier 22, in the embodiment illustrated, is one section of a 6SN7 dual triode tube with the grid connected to the anode. A very small positive voltage is applied to the cathode of tube 22 by means of the potential divider formed by the series connected resistors 24 and 25. This voltage is only for the purpose of reducing the anode potential of rectifier 22 below that of the cathode by a sufficient amount to reduce to zero the electron flow from the cathode to the anode that would otherwise result from the thermal energy of the electrons emitted from the cathode. If allowed to flow this current would cause a small charge in condenser 21 resulting in an undesired negative voltage across terminals 8. With the above described circuit the potential between terminals 8 is zero in the absence of an output signal from amplifier 14. In the presence of an output signal the rectifying action of tube 22 causes condenser 21 to become charged and a resulting potential to appear between terminals 8 with the polarity indicated in Fig. 2. As is usual the time constant of the circuit comprising condenser 21 and resistor 20 should be long as compared to the period of the modulation of the radio frequency signal applied to terminal 7 so that the direct voltage between terminals 8 follows the average value of the radio frequency carrier rather than the modulation envelope.

Provision is made for applying an adjustable positive bias to the grids of tube 14 by connecting a potential divider comprising adjustable potentiometer 26 and resistor 27 connected in series between the point of positive potential 15 and ground. The adjustable contact on potentiometer 26 is connected to a point between resistor 11 and condenser 12 so that a positive potential appears across condenser 12 the value of which is determined by the position of the tap 28 on potentiometer 26. The resistor 27 is small compared to resistor 26 and determines the minimum positive bias that may be applied to the grids of tube 14. However, this resistor may be omitted if desired so that the bias may be reduced to zero. The positive voltage across the condenser 12 tends to make the grid of tube 14 positive with respect to the cathode, however, this results in a flow of current from grid to cathode and the resulting drop across resistors 11 and 13, which may be of the order of 10,000 and 30,000 ohms respectively, subtracts from the voltage across condenser 12 so that the grid never becomes positive with respect to the cathode by more than a very small amount. Hence any increase in the voltage across condenser 12 is absorbed by increase drop across resistors 11 and 13 thus holding the grid near cathode potential for all positions of contact 28. However the current through resistors 11 and 13 will be directly related to the voltage across condenser 12.

When an alternating signal is applied to terminal 7 having a peak amplitude smaller than the voltage across condenser 12 no appreciable change in grid potential of tube 14 occurs since the signal variations are offset by opposing voltage variations across resistors 11 and 13 due to the changing grid current. When the peak signal amplitude becomes equal to the voltage across condenser 12 the total voltage between grid and cathode at the peak of the negative half cycle is reduced to zero. The grid current is likewise zero at this point and therefore produces no drop across resistors 11 and 13 so that the only voltages in the circuit are the voltage across condenser 12 and the signal voltage developed across resistor 11. When the peak value of the signal voltage exceeds the voltage across condenser 12 the grids of tube 14, during the peaks of the negative half cycles, are carried below cathode potential, which causes a positive amplified peak to occur on the anodes of tube 14 for each negative half cycle of the signal. It will be noted that the positive half cycles of the signal will have substantially no effect on the grid potential since the voltage drops across resistors 11 and 13 absorb signal variations in the positive direction.

It is seen from the above discussion that the amplitude of the signal at terminal 7 required to produce an output from tube 14 is determined by the value of the voltage across condenser 12. Since this voltage is adjustable by contact 28 the signal amplitude at which amplifier 14 becomes operative, or the threshold point, may be varied by contact 28. By omission of resistor 27 amplifier 14 may be made operative for all signals, or, in the presence of this resistor, with the contact 28 in the lowest position the amplifier will not become operative until the peak value of the input signal reaches an amplitude equal to the voltage drop across resistor 27 or condenser 12. For higher settings of contact 28 still higher peak values of the input signal are required.

The output from tube 14 is applied across rectifier 22 which acts to cause a direct voltage to appear across resistor 20 having polarity as shown in Fig. 3. Resistor 19 and condenser 21 form a filter network to prevent high frequency fluctuations between terminals 8 and to cause the potential between these terminals to follow the average value of the positive half cycles which constitute the output from tube 14.

The voltage between terminals 8 is used to regulate the gain of preceding radio frequency amplifiers in the receiver as already explained. The circuit operates so that for signals at terminal 7 having peak amplitudes below the voltage across condenser 12 produce no voltage between terminals 8, whereas for signals exceeding this value the resulting negative voltage between terminals 8 operates to reduce the gain of the receiver to maintain the signal at terminal 7 substantially constant at the value determined by the setting of contact 28.

I claim as my invention:

1. A circuit for use in automatic gain control systems and operating to convert a radio frequency voltage into a direct gain control voltage, said circuit comprising an amplifier tube having an anode, a cathode and a grid, a first resistor, a second resistor and a source of positive biasing voltage connected in series in the order named between said grid and cathode, means for applying a radio frequency voltage to said second resistor, means for applying a positive voltage to said anode of sufficiently high value to insure substantially linear operation of said amplifier tube for all values of negative radio frequency voltage greater than said biasing potential, a rectifying means connected between said anode and cathode, and a load resistor connected in shunt to said rectifying means whereby radio frequency voltages exceeding said biasing voltage produce a direct voltage across said load resistor substantially proportional to the difference between said biasing voltage and said radio frequency voltage.

2. Apparatus as claimed in claim 1 in which said rectifying means is a diode having an anode and a cathode and in which a small positive potential is applied to the cathode to prevent current flow in said diode due to the thermal energy of the electrons emitted from the cathode.

3. Apparatus as claimed in claim 2 in which said load resistor is shunted by a condenser of sufficient size to cause the voltage across said load resistor to follow the average value of the high frequency voltage applied to the rectifier.

4. A circuit for use in automatic gain control systems and operating to convert a radio frequency voltage into a direct gain control voltage, said circuit comprising an amplifier tube having an anode, a cathode and a grid, a grid circuit connecting the grid of said tube to the cathode thereof, means for introducing a radio frequency voltage and a direct biasing voltage into said grid circuit, said biasing voltage being poled so as to make the grid positive relative to the cathode, means providing series resistance in said grid circuit, said series resistance being sufficiently high to maintain said grid substantially at cathode potential except in the presence of a negative radio frequency voltage of greater value than said biasing voltage, an output circuit containing a source of anode voltage connected between the anode and cathode of said amplifier, the voltage of said anode having a sufficiently high value to insure substantially linear operation of said amplifier tube for all values of negative radio frequency voltage greater than said biasing voltage, and means coupled to said output circuit for rectifying the output of said amplifier tube to develop a direct gain control voltage.

EDWARD R. TOPORECK.

REFERENCES CITED

The following references are of record in the file of this patent:

UNITED STATES PATENTS

| Number | Name | Date |
|---|---|---|
| 2,152,824 | Schlesinger | Apr. 4, 1939 |
| 2,385,212 | Konrad | Sept. 18, 1945 |